United States Patent
Wu et al.

(10) Patent No.: US 7,188,329 B2
(45) Date of Patent: Mar. 6, 2007

(54) COMPUTER-ASSISTED ELECTRONIC COMPONENT SCHEMATIC LINKING METHOD

(75) Inventors: Fu-Chung Wu, Taipei (TW); Chun-Liang Lee, Taipei (TW); Shu-Yun Chen, Taipei (TW); Jui-Chi Huang, Taipei (TW); Tze-Hsin Peng, Taipei (TW); Kuang-Yu Peng, Taipei (TW)

(73) Assignee: Inventec Corporation, Taipei (TW)

( * ) Notice: Subject to any disclaimer, the term of this patent is extended or adjusted under 35 U.S.C. 154(b) by 480 days.

(21) Appl. No.: 10/777,653

(22) Filed: Feb. 13, 2004

(65) Prior Publication Data

US 2005/0183043 A1    Aug. 18, 2005

(51) Int. Cl.
*G06F 17/50* (2006.01)
(52) U.S. Cl. .................... 716/11; 716/3; 716/7
(58) Field of Classification Search .............. 716/11, 716/3, 7
See application file for complete search history.

(56) References Cited

U.S. PATENT DOCUMENTS

| | | | | |
|---|---|---|---|---|
| 5,164,911 | A * | 11/1992 | Juran et al. ............... | 716/11 |
| 5,850,348 | A * | 12/1998 | Berman .................... | 716/6 |
| 5,898,595 | A * | 4/1999 | Bair et al. ................ | 716/2 |
| 5,903,469 | A * | 5/1999 | Ho .......................... | 716/5 |
| 5,995,730 | A * | 11/1999 | Blinne ..................... | 716/4 |
| 5,999,726 | A * | 12/1999 | Ho .......................... | 716/11 |
| 6,110,223 | A * | 8/2000 | Southgate et al. ....... | 716/18 |
| 6,132,109 | A * | 10/2000 | Gregory et al. .......... | 717/131 |
| 6,237,007 | B1 * | 5/2001 | Brown .................... | 707/104.1 |
| 6,272,671 | B1 * | 8/2001 | Fakhry .................... | 716/18 |
| 6,438,729 | B1 * | 8/2002 | Ho .......................... | 716/1 |
| 6,499,134 | B1 * | 12/2002 | Buffet et al. ............. | 716/12 |
| 6,510,405 | B1 * | 1/2003 | Gilbertson ............... | 703/16 |
| 6,516,456 | B1 * | 2/2003 | Garnett et al. ........... | 716/8 |
| 6,530,065 | B1 * | 3/2003 | McDonald et al. ....... | 716/4 |
| 6,588,004 | B1 * | 7/2003 | Southgate et al. ....... | 716/11 |
| 6,684,376 | B1 * | 1/2004 | Kerzman et al. ......... | 716/8 |
| 6,738,957 | B2 * | 5/2004 | Gont et al. .............. | 716/11 |
| 6,791,336 | B2 * | 9/2004 | Krigel .................... | 324/539 |
| 6,851,094 | B1 * | 2/2005 | Robertson et al. ....... | 716/1 |
| 6,877,147 | B2 * | 4/2005 | Kidd et al. .............. | 716/12 |
| 6,907,583 | B2 * | 6/2005 | Abt et al. ................ | 716/1 |
| 6,910,200 | B1 * | 6/2005 | Aubel et al. ............. | 716/9 |
| 2002/0108095 | A1 * | 8/2002 | Barney et al. .......... | 716/10 |
| 2002/0144212 | A1 * | 10/2002 | Lev et al. ................ | 716/1 |
| 2002/0188910 | A1 * | 12/2002 | Zizzo ..................... | 716/1 |
| 2003/0084409 | A1 * | 5/2003 | Abt et al. ................ | 716/1 |
| 2003/0221172 | A1 * | 11/2003 | Brathwaite et al. ...... | 716/1 |
| 2004/0034842 | A1 * | 2/2004 | Mantey et al. .......... | 716/15 |

(Continued)

*Primary Examiner*—Phallaka Kik
(74) *Attorney, Agent, or Firm*—Birch, Stewart, Kolasch & Birch, LLP

(57) ABSTRACT

A computer-assisted schematic linking method for electronic components includes naming the circuits of various electronic components according to signal line naming conventions; storing in an electronic component specification data base; selecting a plurality of first electronic components from the electronic component data base to generate a first electronic component list for users to select the first electronic components; searching second electronic components from the electronic component data base corresponding to the selected first electronic components and generating a second electronic component list for users to select the second electronic components; processing schematic linking operation for the first electronic components and the second electronic components; and repeating the foregoing steps to select other electronic components until a complete schematic chart is finished.

9 Claims, 4 Drawing Sheets

U.S. PATENT DOCUMENTS

2004/0128638 A1* 7/2004 Kerzman et al. ............. 716/11
2004/0268283 A1* 12/2004 Perry et al. .................. 716/11
2005/0278670 A1* 12/2005 Brooks et al. ................. 716/5

* cited by examiner

COMPUTER-ASSISTED ELECTRONIC COMPONENT SCHEMATIC LINKING METHOD

FIELD OF THE INVENTION

The invention relates to a schematic linking method adopted for use in electronic information product manufacturing industries and particularly to a computer-assisted automatic linking method for schematic linking of electronic components.

BACKGROUND OF THE INVENTION

These days a wide variety of electronic information products are used by individuals, enterprises, and research organizations, such as a notebook computer, desktop PC, Personal Digital Assistant (PDA), server, and the like. They are deeply involved in every aspect of people's life.

As the process functions of those products become more powerful, the functionality of the products also increase tremendously. And changing speed increases rapidly. It becomes very important for vendors to develop and introduce the newest products to the market place in the shortest possible time.

During product design and development stage, various electronic components required in product operation have to be coupled and connected. There is a wide range of electronic components such as a Central Processing Unit, Random Access Memory, North Bridge chipset, South Bridge chipset, and all sorts of expansion buses, etc. In general, these electronic components are linked by schematic charts. The schematic chart is made by engineers based on experiences and product data and specifications of the electronic components. Referring to FIG. 3, engineers have to link the individual circuit of the electronic components to be coupled. As the vendors of a first electronic component and a second electronic component might be different, naming of the circuit also could be different. As shown in the drawing, a connection leg circuit for a first electronic component might be named "FRAME", while another connection leg circuit for a second electronic component might be named "FG_FRAME". But actually the connection leg circuits of these two electronic components are linked to a same Peripheral Component Interconnect Bus (PCI Bus). Hence the schematic linking operation of the connection legs of the first electronic component and the second electronic component that are to be linked to the same PCI bus has to rely on the experiences of engineers and has to refer to product specification data provided by component vendors for their circuit characteristics.

The method mentioned above has the following drawbacks:

1. As there are a great number of electronic components, even the new electronic components that are designed by modifying the similar products still could result in erroneous schematic linking. As a result, product development time increases.
2. Input and modifying of the parameters and attributes of the electronic components in the schematic chart usually is performed by engineers manually. It is easy to incur data input error and a waste of time.
3. Different names of circuits and signal lines of various electronic components are difficult to distinguish. As the product generally is jointly designed and developed by many people, the finished modules often do not have uniform standards. This increases the difficulty of recognizing and sharing the modules.

Because of the aforesaid disadvantages, errors and waste of time on schematic chart design have been a nasty problem in the product development remained to overcome.

SUMMARY OF THE INVENTION

Therefore the present invention aims to provide a computer-assisted schematic linking method for electronic components to prevent erroneous schematic linking during product development and reduce product design time.

The computer-assisted schematic linking method for electronic components according to the invention includes uniforming naming specifications for circuits and signal lines of electronic components according to signal line naming conventions, and storing the specification data of the electronic components in an electronic component specification data base. Then generating a first electronic component list from the electronic component specification database to enable users to select the first electronic component. After that, searching a corresponding second electronic component from the electronic component specification database based on the selected first electronic component. Then sorting the found second electronic components by category to provide a second electronic component list for users to select the second electronic components. Finally, performing a schematic linking operation of the first electronic component and the second electronic component, and based on the schematic linking operation generating a result report for user reference.

The computer-assisted schematic linking method for electronic components according to the invention has signal line naming conventions to uniforming naming specifications for circuits and signal lines of electronic components, thus the specifications of the circuits and signal lines are made according to standards. Therefore users can easily to distinguish and effectively prevent erroneous schematic linking. In addition, the plotted schematic chart has uniform specifications for the circuit and signal lines of the electronic components, hence the resulting schematic module is reusable. When there is a similar product to be developed in the future, the existing schematic module may be directly used. Hence new product design and development time can be greatly reduced. In other words, the computer-assisted schematic linking method for electronic components according to the invention, besides being able to reduce product design time and prevent waste of manpower, can also reduce unnecessary linking errors on the schematic charts and improve product design quality.

The foregoing, as well as additional objects, features and advantages of the invention will be more readily apparent from the following detailed description, which proceeds with reference to the accompanying drawings.

DESCRIPTION OF THE PREFERRED EMBODIMENTS

When engineers are in the process of product design and development, they have to link the circuits and signal lines for electronic components such as a Central Processing Unit, Random Access Memory, North Bridge chipset, South Bridge chipset, various expansion buses and the like. And schematic charts for linking the circuits and signal lines of the electronic components are made, based on product data and specifications of the electronic components. The computer-assisted schematic linking method for electronic components according to the invention aims at reducing product development time and error probability during design of the schematic charts.

Figure 1:
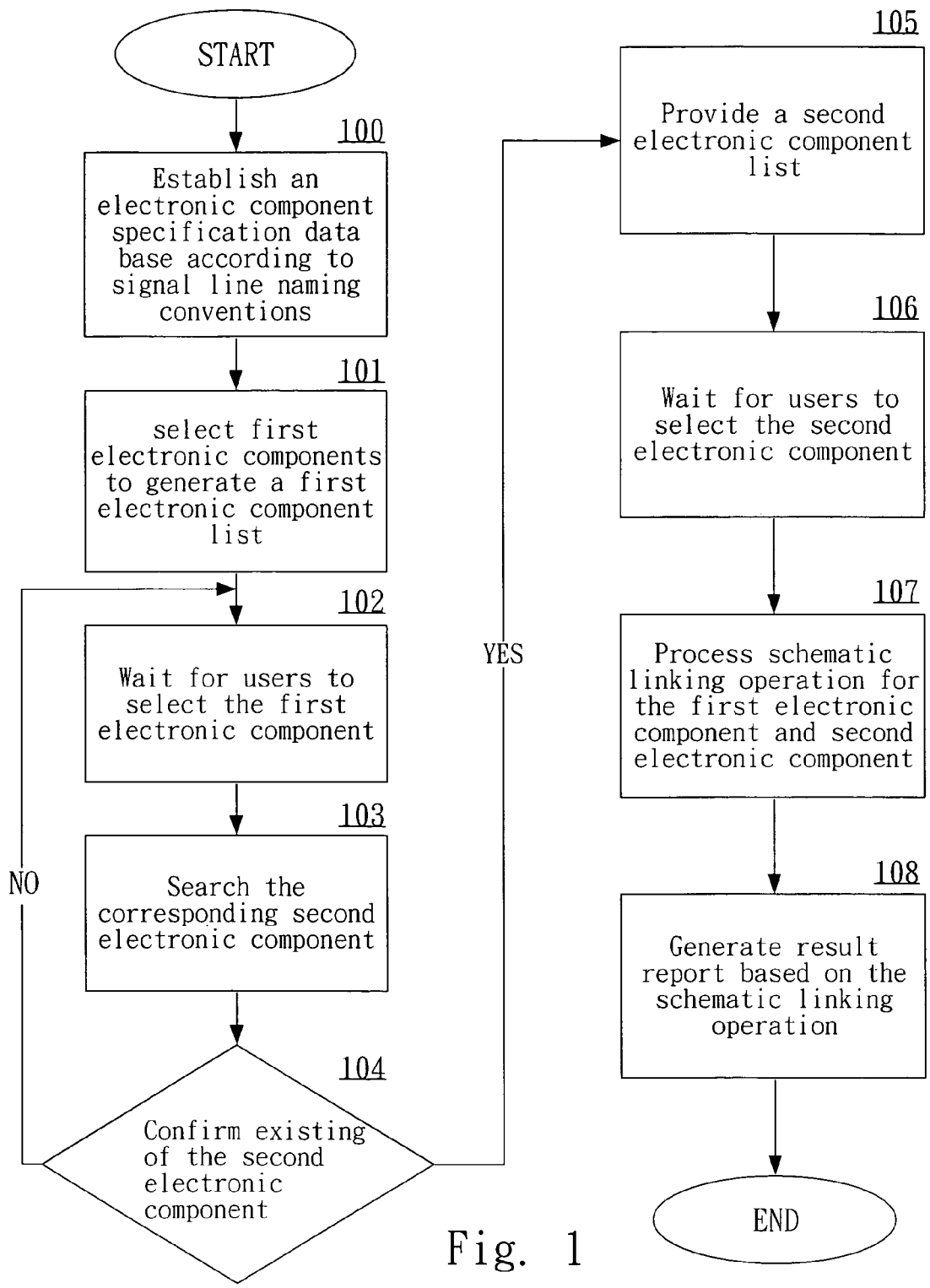
FIG. 1 is the main process flow chart of the computer-assisted schematic linking method for electronic components according to the invention.

FIG. 1 refers to the overall process flow. First, etablish an electronic component specification database according to signal line naming conventions (step 100). The process of setting up an electronic component database will be discussed later. Then select one or more first electronic components from the electronic component database to generate a first electronic component list (step 101). The first electronic component list includes name and attributed data of the first electronic component. The circuit name of the first electronic component is defined according to the signal line naming conventions. Then wait for users to select the first electronic component (step 102). Search a corresponding second electronic component from the electronic component database according to the attribute data of the selected first electronic component (step 103). Meanwhile, system programs confirm whether the corresponding second electronic component exists (step 104). When there is no corresponding second electronic component, return to step 102 to enable users to select other first electronic components. If there is a corresponding second electronic component, provide a second electronic component list (step 105). The second electronic component list includes name and attributed data of the second electronic component. The circuit name of the second electronic component is defined according to the signal line naming conventions. Then the system programs wait for users to select the second electronic component (step 106). Once the users select the second electronic component, schematic linking operation of the first electronic component and the second electronic component is performed (step 107). Then a result report is generated for user reference, based on the schematic linking operation (step 108).

The contents of the result report, besides the linking status of the first electronic component and the second electronic component, also include unlinking circuits between the first electronic component and the second electronic component, and highlight messages of erroneous schematic linking. Hence users can be easily informed of the linking conditions between the first electronic component and the second electronic component by reading the result report. And modifications can be made to fix the error portion.

Figure 2:
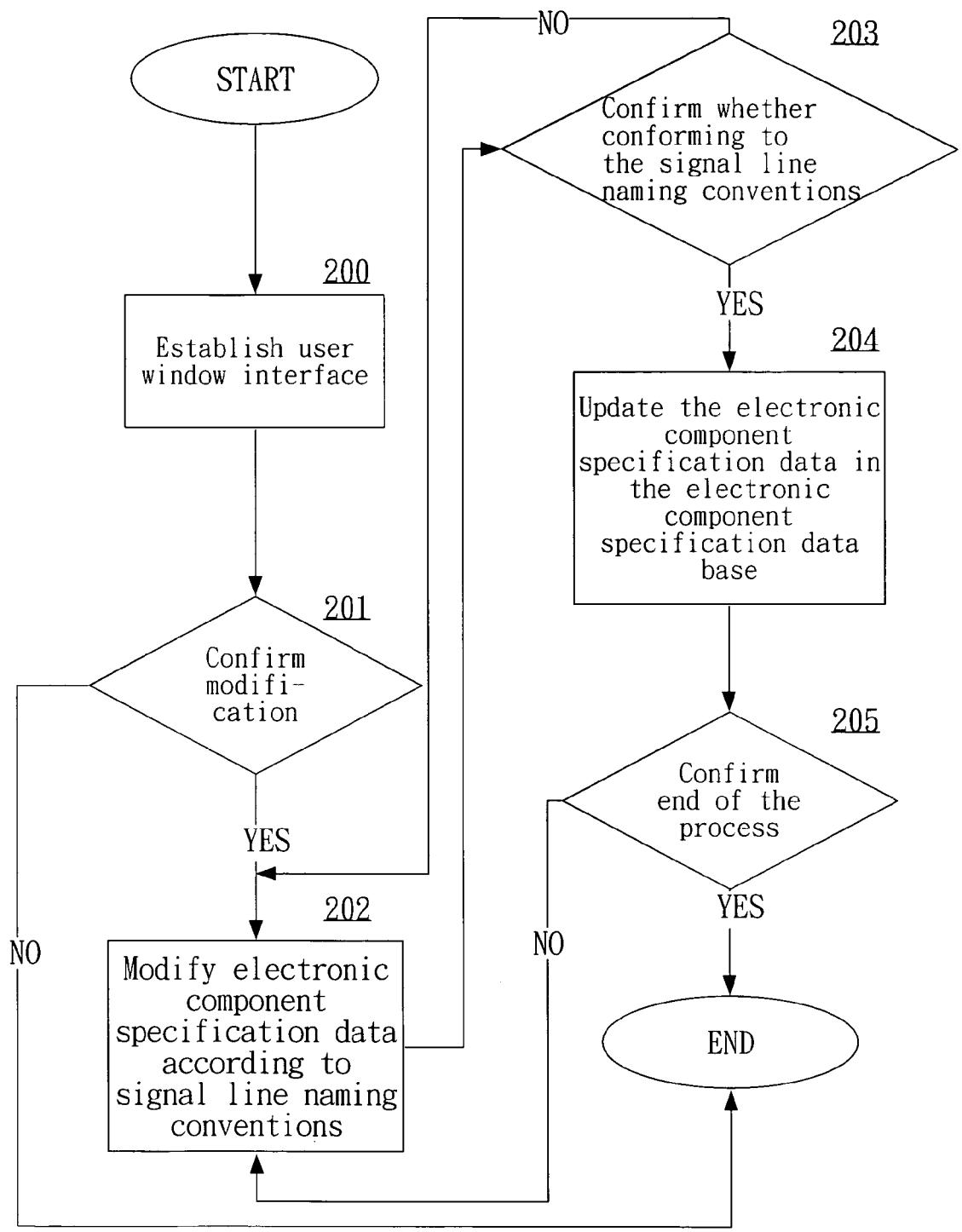
FIG. 2 is a flow chart for establishing the electronic component specification data base according to the method of the invention.

FIG. 2 refers to the process of establishing electronic component specification data base mentioned previously at step 100. The electronic component specification data base not only contains the specifications and circuit data of the first and second electronic components, but also stores any specifications and circuit data of various electronic components that are required for electronic information product design and development. In other words, if users want to add new electronic components or modify the electronic component specifications and circuit data stored in the electronic component specification data base, first, system programs will establish a user window interface (step 200). Then provide reminding messages to inform users to proceed modification of the contents of the electronic component specification database (step 201). If the user does not want to modify the contents of the electronic component specification database, the process has ended. If the user intends to modify the electronic component specification data base, he/she can add new specification data of the electronic component or modify the specification data of the electronic component previously stored in the electronic component specification data base, according to the signal line naming conventions (step 202). The system programs compare and confirm whether the additions or modifications conform to the signal line naming conventions (step 203). If conformation is violated, return to step 202 for revision. Otherwise, the modified portion is updated in the electronic component specification database (step 204). Finally confirm whether the updating process of the electronic component specification data base is to be ended (step 205); if more other modifications are to be performed, enter step 202. Otherwise, end the whole process.

Figure 3:
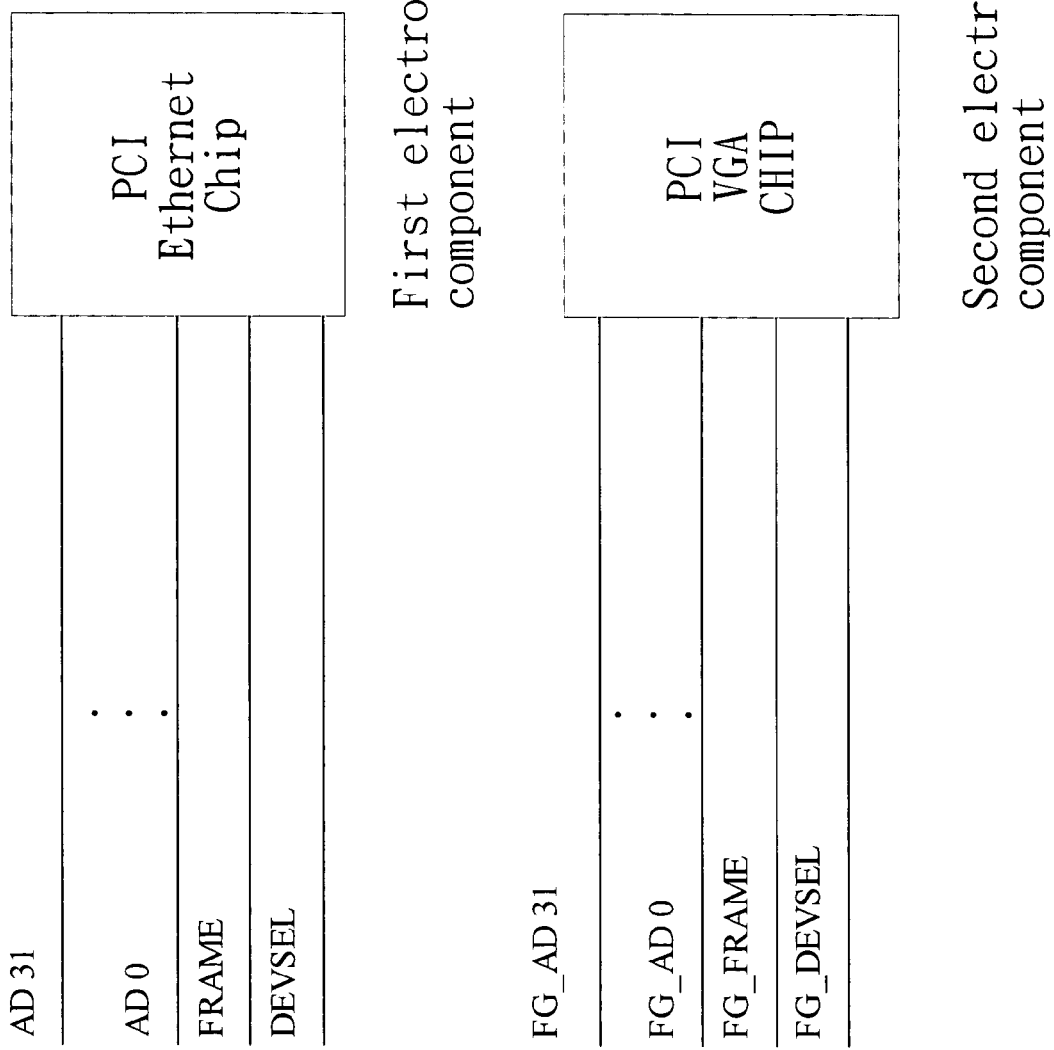
FIG. 3 is a schematic chart for naming the initial circuit of a first electronic component and a second electronic component.
Figure 4:
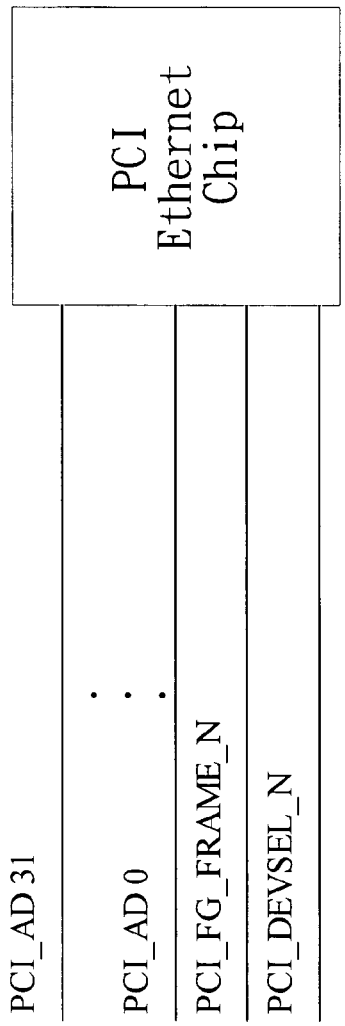
FIG. 4 is a schematic chart for renaming the circuit of a first electronic component and a second electronic component according to signal line naming conventions.
Figure 4:
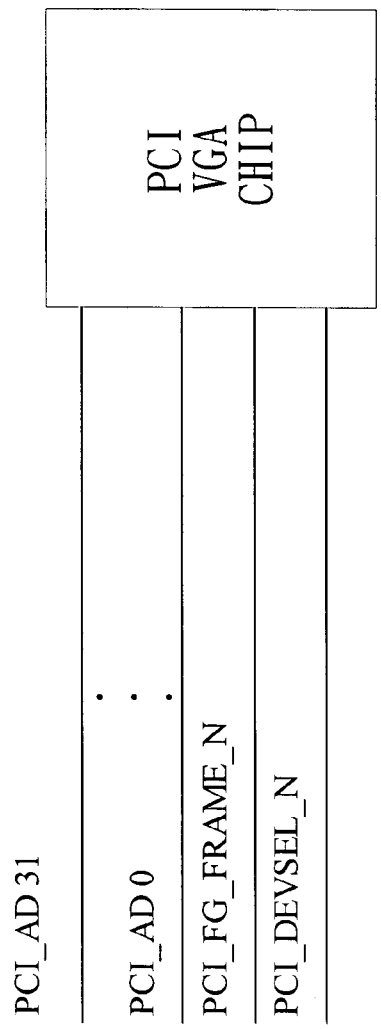

FIG. 4 refers to for re-naming connection legs of electronic components according to signal line naming conventions. Take the first and second electronic components in FIG. 3 as examples. Some of the connection legs of the first electronic component are originally named "FRAME", "DEVSEL", "AD0" to "AD31", etc. According to the signal line naming conventions, the corresponding signal line names obtained for the first electronic component are "PCI_FRAME_N", "PCI_DEVSEL_N", "PCI_AD 0" "PCI_AD 31", etc. Similarly, some of the connection legs of the second electronic component are originally named "FG_FRAME", "FG_DEVSEL", "FG_AD0" to "FG_AD31", etc. According to the signal line naming conventions, the corresponding signal line names for the second electronic component are "PCI_FRAME_N", "PCI_DEVSEL_N", "PCI_AD 0" to "PCI_AD 31", etc. Hence, when users select the first and second electronic components for linking, the system generates a complete schematic chart.

The computer-assisted automatic linking method for schematic linking of electronic components according to the invention names circuits and signal lines of various electronic components according to signal line naming conventions; hence all specifications can be made, based on the same standards. Users can easily recognize and prevent erroneous schematic linking. Moreover, because circuits and signal lines of electronic components have uniform specifications, the schematic modules in the plotted schematic charts are reusable. It's also easier to distinguish circuits. When similar products are to be developed in the future, the schematic modules previously plotted may be used directly. Thus new product design and development is much faster.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A computer-assisted schematic linking method for electronic components, comprising steps of:
   - establishing an electronic component specification data base according to a signal line naming convention;
   - selecting one or more first electronic component from the electronic component data base to generate a first electronic component list for users to select the first electronic component;
   - searching one or more second electronic component from the electronic component data base corresponding to the selected first electronic component;
   - providing a second electronic component list based on said searching step, for users to select the second electronic component; and
   - processing schematic linking operation for linking the first electronic component and the second electronic component.

2. The method of claim 1, further comprising circuit naming for the first electronic component according to the signal line naming convention.

3. The method of claim 1, further comprising circuit naming for the second electronic component according to the signal line naming convention.

4. The method of claim 1, wherein the first electronic component list includes component name and attribute data of the first electronic component.

5. The method of claim 1, wherein the second electronic component list includes component name and attribute data of the second electronic component.

6. The method of claim 1, wherein the schematic linking operation for linking the first electronic component and the second electronic component further includes generating a result report.

7. The method of claim 6, wherein the result report includes reminding message data of errors occurred to the schematic linking operation of the first electronic component and the second electronic component.

8. The method of claim 1, wherein the establishing an electronic component specification data base according to a signal line naming convention further includes steps of:
   - establishing a user window interface;
   - adding and modifying specification data of an electronic component according to the signal line naming convention; and
   - updating the electronic component specification data in the electronic component specification data base.

9. The method of claim 8, wherein the modifying specification data of an electronic component according to the signal line naming convention further includes comparing and confirming conformation of the electronic component specification data to the signal line naming convention.

* * * * *